US008609984B2

(12) United States Patent
Bhattacharya et al.

(10) Patent No.: US 8,609,984 B2
(45) Date of Patent: Dec. 17, 2013

(54) HIGH EFFICIENCY PHOTOVOLTAIC CELL FOR SOLAR ENERGY HARVESTING

(75) Inventors: Indranil Bhattacharya, Tallahassee, FL (US); Simon Y. Foo, Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 370 days.

(21) Appl. No.: 12/822,343

(22) Filed: Jun. 24, 2010

(65) Prior Publication Data
US 2010/0326496 A1  Dec. 30, 2010

Related U.S. Application Data

(60) Provisional application No. 61/219,926, filed on Jun. 24, 2009.

(51) Int. Cl.
*H01L 31/00* (2006.01)
*H01L 31/042* (2006.01)

(52) U.S. Cl.
USPC .............. 136/262; 136/249; 136/244

(58) Field of Classification Search
USPC ........................................ 136/262
See application file for complete search history.

(56) References Cited

U.S. PATENT DOCUMENTS

| 4,255,211 A | 3/1981 | Fraas |
| 4,384,317 A * | 5/1983 | Stackpole ............... 362/183 |
| 4,404,422 A | 9/1983 | Green |
| 4,927,770 A | 5/1990 | Swanson |
| 5,019,177 A * | 5/1991 | Wanlass ............... 136/249 |
| 5,407,491 A | 4/1995 | Freundlich |
| 5,853,497 A | 12/1998 | Lillington |
| 6,316,715 B1 | 11/2001 | King |
| 7,119,271 B2 | 10/2006 | King |
| 7,122,734 B2 * | 10/2006 | Fetzer et al. ............ 136/252 |
| 7,148,417 B1 * | 12/2006 | Landis ................. 136/262 |
| 7,635,879 B2 | 12/2009 | Boos |
| 2003/0070707 A1 | 4/2003 | King |
| 2004/0200523 A1 * | 10/2004 | King et al. ............ 136/262 |

FOREIGN PATENT DOCUMENTS

WO   WO 2009/082816   *  7/2009

OTHER PUBLICATIONS

King et al, Mar. 8, 2007, "40 percent efficient metamorphic GaInP_GaInAs_Ge multijunction solar cell".*
Zierak et al, 1997, "Modeling of InGaSb Thermophotovoltaic cells and materials".*

(Continued)

*Primary Examiner* — Alicia Toscano
*Assistant Examiner* — Uyen Tran
(74) *Attorney, Agent, or Firm* — Novak Druce Connolly Bove + Quigg LLP

(57) ABSTRACT

A photovoltaic cell comprising having improved absorption of electromagnetic radiation is disclosed. The photovoltaic cell can include a rear contact, a first cell having a first band-gap energy, and a rear contact in electrical communication with an electromechanical device. The first cell can include $In_xGa_ySb_z$, where $x+y+z=1$ and z ranges from 0.00001 to 0.025. the photovoltaic cell can also include a second cell having a second band-gap energy, and a first tunnel disposed between the first and second cells. The photovoltaic cell can include at least a third cell and a second tunnel disposed between the second and third cells. The uppermost cell can include GaP or InP.

21 Claims, 16 Drawing Sheets

(56) References Cited

OTHER PUBLICATIONS

King, R. R., Law, D. C., Edmondson, K. M., Fetzer, C. M., Kinsey, G. S., Yoon, H., & Karam, N. H. (2007). 40% efficient metamorphic GaInP/GaInAs/Ge multijunction solar cells. Applied physics letters, 90, 183516.

Bertness, K. A., D. J. Friedman, Sarah R. Kurtz, A. E. Kibbler, C. Kramer, and J. M. Olson. "High-efficiency GaInP/GaAs tandem solar cells." Aerospace and Electronic Systems Magazine, IEEE 9, No. 12 (1994): 12-17.

* cited by examiner

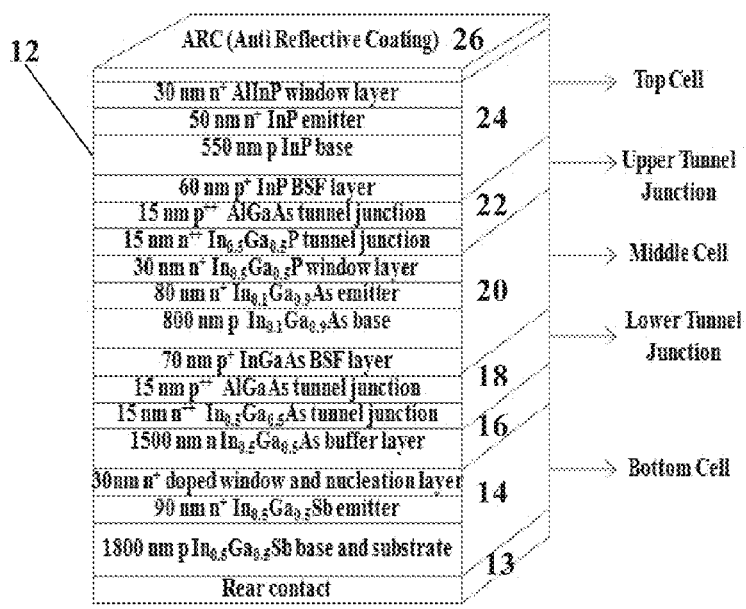
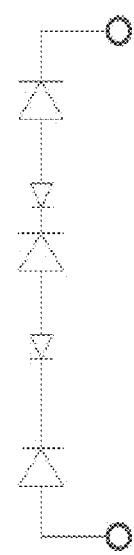
FIG. 3
FIG. 4

US 8,609,984 B2

HIGH EFFICIENCY PHOTOVOLTAIC CELL FOR SOLAR ENERGY HARVESTING

CROSS REFERENCE TO RELATED APPLICATIONS

This application claims priority to U.S. Provisional Application No. 61/219,926, entitled "High Efficiency Photovoltaic Cell for Solar Energy Harvesting," filed Jun. 24, 2009, the entirety of which is incorporated herein by reference.

FIELD OF THE INVENTION

The invention is drawn to a high efficiency photovoltaic cell for solar energy harvesting, in particular a high efficiency photovoltaic cell that includes indium gallium antimonide.

BACKGROUND OF THE INVENTION

Sunlight is the most abundant renewable energy source available on Earth, supplying over $1.5 \times 10^{22}$ J (15,000 Exajoules) of energy to the Earth's surface daily. This amount of energy is 10,000 times greater than the 1.3EJ of energy consumed daily by the Earth's population. However, the capital costs involved with harvesting solar energy make supplying energy to the electrical grid using photovoltaic ("PV") generation unfavorable compared to existing standard technology, e.g., coal, nuclear, etc. Thus, substantial improvements are necessary to justify a shift from existing power generation technologies to photovoltaic-generated energy.

The main challenge in the photovoltaic industry is making solar cells more cost effective. Thus, it is desirable to produce less expensive cells with higher efficiencies. To date, the National Renewable Energy Lab (NREL) is believed to have achieved a record efficiency of 40.7% (AM1.5D, low AOD, 240 suns, 25° C.) for metamorphic or lattice mismatched and 40.1% (AM1.5D, low AOD, 135 suns, 25° C.) for lattice matched three-junction photovoltaic cells such as GaInP/GaInAs/Ge cells. However, this is well below the desired efficiency of 60% or higher believed necessary to make PV technology a feasible substitute for existing power generation technologies, so additional improvements are necessary.

SUMMARY OF THE INVENTION

In one embodiment, the invention is drawn to a photovoltaic cell including a rear contact and a first cell, having a first band-gap energy, supported by the rear contact layer. The first cell includes $In_xGa_ySb_z$, where $x+y+z=1$ and z ranges from 0.00001 to 0.025.

The photovoltaic cell can also include a second cell, having a second band-gap energy, and a first tunnel disposed between the first cell and the second cell. The second cell can be supported by the first cell. The first band-gap energy can be less than the second band-gap energy. The first cell can include both an $n^+$-doped $In_xGa_ySb_z$ semiconductor layer and a p-doped $In_xGa_ySb_z$ semiconductor layer.

The photovoltaic cell can also include a third cell, having a third band-gap energy, and a second tunnel disposed between the second cell and the third cell. The third cell can be over the second cell and the second band-gap energy can be less than the third band-gap energy.

The $In_xGa_ySb_z$ semiconductor layer can have the following values for x, y and z:
x ranges from 0.23 to 0.50,
y ranges from 0.50 to 0.77, and
z ranges from 0.00001 to 0.025.

The third cell can include one or more of InP, GaP, AlInP and InGaSb, the second cell can include one or more of InGaAs, InP and InGaP, or both. The first tunnel can include a $p^{++}$-type GaAs or a $p^{++}$-type AlGaAs semiconductor layer and an $n^{++}$-type GaAs or $n^{++}$-type InGaAs semiconductor layer; the second tunnel can include a $p^{++}$-type GaAs or a $p^{++}$-type AlGaAs semiconductor layer and an $n^+$-type GaAs or a $n^{++}$-type InGaP semiconductor layer; or both.

In another embodiment, the invention is drawn to a system for harvesting solar energy. The system can include an electromechanical device in electrical communication with at least one photovoltaic cell described herein.

These and other embodiments are described in more detail below.

BRIEF DESCRIPTION OF THE DRAWINGS

A fuller understanding of the present invention and the features and benefits thereof will be obtained upon review of the following detailed description together with the accompanying drawings, in which:

FIG. 3 is a cross-sectional view of a multi-junction InP/InGaAs/InGaSb photovoltaic cell according to an embodiment of the invention.

FIG. 4 is an electrical equivalent diagram representing a photovoltaic cell having three cells and two tunnel junctions.

DETAILED DESCRIPTION

Figure 1A:
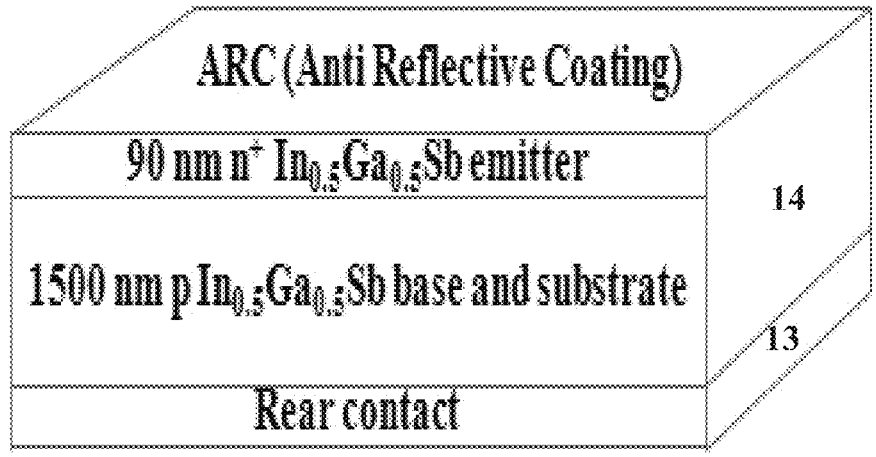
FIGS. 1A and 1B are cross-sectional views of single-cell photovoltaic cells according to an embodiment of the invention.

Photovoltaic cells having improved absorption efficiency of electromagnetic radiation over existing solar cells are described herein. As shown in the accompanying figures, the photovoltaic cell 12 can include a rear contact 13, a first cell 14 having a first band-gap energy, a second cell 20 having a second band-gap energy and a first tunnel 18. The first tunnel 18 can be disposed between the first cell 14 and the second cell 20. A buffer layer 16 can be disposed between the first tunnel 18 and the first cell 14; between the second cell and the first tunnel 18; or both. The first cell 14 can be over the rear contact 13 and the second cell 20 can be over the first cell 14. The first cell 14 can include $In_xGa_ySb_z$, where x+y+z=1 and z ranges from 0.0025 to 0.00001. An anti-reflective coating ("ARC") 26 can be over or disposed on the upper portion of the photovoltaic cell 12. For example, the ARC 26 can be the uppermost layer of the photovoltaic cell 12. The ARC 26 can include one or more of $MgO_2+TiO_2$, Indium-Tin Oxide+ $MgF_2$, $ZnS+MgF_2$ and $TiO_2+Al_2O_3$.

Figure 1B:
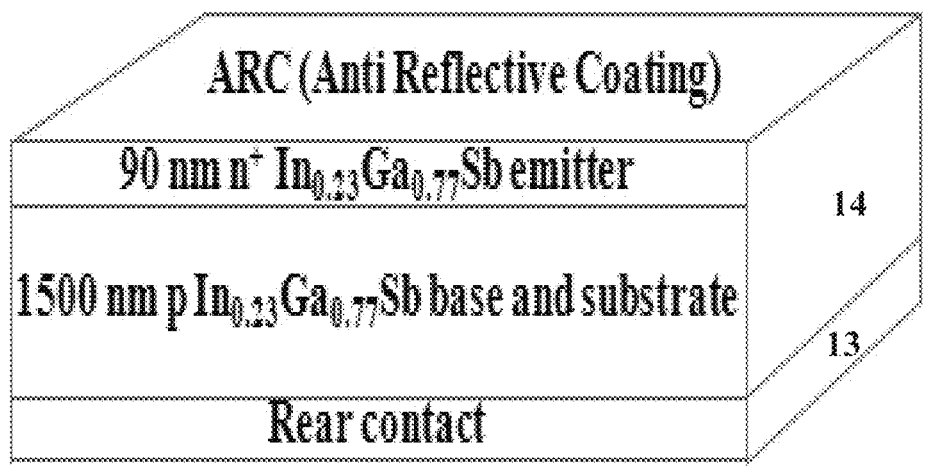

As shown in FIGS. 1A and 1B, the photovoltaic cell 12 can be a single cell device, where the first cell 14 includes $In_xGa_ySb_z$, where x+y+z=1 and z ranges from 0.0025 to 0.00001. The single cell embodiment can include an anti-reflective coating 26 supported or disposed on the first cell 14 and the first cell 14 can be supported or disposed on the rear contact 13. The rear contact layer 13 described herein can be any conductive or semiconductor material, such as a metal, alloy, ceramic, or cermet, and can be in electrical communication with an electromechanical device 30 for usage or storage of the electromagnetic radiation harvested by the photovoltaic cell 12. The rear contact 13 can also be in electrical communication with the first layer 14.

As shown in FIGS. 2-3 and 5-9, the photovoltaic cell 12 can also include a third cell 24, having a third band-gap energy, and a second tunnel 22. The second tunnel 22 can be disposed between the second cell 20 and the third cell 24. The third cell 24 can be over the second cell 20. Although not shown, a buffer layer 16 can be disposed between the second cell 20 and the second tunnel 22; between the second tunnel 22 and the third cell 24; or both. Each of the layers, cells and tunnels included in the photovoltaic cell can be in electrical communication with one another.

As used herein, the terms "tunnel," "junction," and "tunnel junction" are used interchangeably to describe heavily doped $p^{++}$-$n^{++}$ junctions between cells. Tunnel junctions are used to make electrical, optical and/or mechanical connections between cells, electrochemical devices or both. Tunnels can be formed of GaAs, AlGaAs, InGaP and/or InGaAs semiconductor layers or other semiconductor layers.

As used herein, heavily doped layers are designated as $p^{++}$ or $n^{++}$ layers and have doping levels of at least $10^{19}$ atoms/cm$^3$ and less than $10^{24}$ atoms/cm$^3$. Other doping levels of interest include those designated as p, $p^+$, n or $n^+$ layers and have doping levels ranging from $10^{16}$ to less than $10^{19}$ atoms/cm$^3$. Layers with $n^+$ or $p^+$ doping levels can range from $10^{16}$ to greater than $10^{19}$ atoms/cm$^3$; however, $n^+$ or $p^+$ layers generally have doping levels ranging from $10^{19}$ to less than $10^{19}$ atoms/cm$^3$. Layers with n or p doping levels generally have doping levels ranging from $10^{16}$ to less than $10^{15}$ atoms/cm$^3$. Lightly doped layers are indicated as $p^-$ or $p^-$ layers and have doping levels of less than $10^{16}$ atoms/cm$^3$. Exemplary p doping elements for use herein include, but are not limited to, Zn, Be, Mg, Cd, Si, C and Ge. Exemplary n doping elements for use herein include, but are not limited to, Si, S, Se, Te, Sn, C and Ge.

As used herein, the terms "over" and "supported on" are used to describe the relative position of two layers where one layer is above or supported by the other in a multilayer stacked composite. As used herein, the phrase "disposed on" is used to describe the relative position of two layers where one layer is over a second layer and in direct contact with the second layer. It is intended that "over" encompasses "disposed on." Thus, where a first layer is over a second layer, it is intended to cover embodiments where a first layer is disposed on second layer. For example, in a three layer structure where a tunnel is disposed between a first (bottom) layer and a second (top) layer, the second layer is over, but not disposed on, the first layer. However, the second layer can be described as over the tunnel or disposed on the tunnel.

As used herein, the term "cell," e.g., "first cell," "second cell," etc., is used to describe one or more semiconductor layers for absorbing electromagnetic radiation having a targeted band-gap energy. Cells can include or be bound above and below by an antireflective coating, a tunnel junction, a window layer, a nucleation layer, a BSF layer, a passivation layer, a confinement layer, a buffer layer, a cladding layer, or some other functional layer. The cells act to create electron-hole pairs when illuminated by the sun.

As used herein, the phrase "photovoltaic cell" is used to describe a layered composite including at least one cell and at least one junction or rear contact for harvesting solar energy. A photovoltaic cell will generally have an antireflective layer applied as the uppermost layer, e.g., disposed on the uppermost layer of the uppermost cell.

The second band-gap energy can be greater than the first band-gap energy and the third band-gap energy can be greater than the second band-gap energy. In some embodiments, the band-gap energy of the third cell, e.g., comprising GaP or InP, can be 1.35 eV, the band-gap energy of the second cell, e.g., comprising InGaAs, can be 1.1 eV and the band-gap energy of the first cell, e.g., comprising InGaSb, can be in the range of 0.3 to 0.5 eV.

The first band-gap energy can be 0.55 eV or less, or 0.50 eV or less, or 0.45 eV or less, or 0.40 eV or less. The first band-gap energy can be at least 0.2 eV, or at least 0.25 eV, or at least 0.3 eV, or at least 0.35 eV.

Any of the first, second, and third cells can include an InGaSb semiconductor layer. The first cell can include at least one InGaAs semiconductor layer and at least one $In_xGa_ySb_z$ semiconductor layer. The first cell can also include at least one n-doped or $n^+$-doped semiconductor layer and at least one p-doped or $p^+$-doped semiconductor layer. The InGaSb semiconductor layer can include $In_xGa_ySb_z$ where:

x ranges from 0.23 to 0.50, y ranges from 0.5 to 0.77, z ranges from 0.00001 to 1, or 0.00001 to 0.01, or 0.00001 to 0.005, or 0.00001 to 0.00025, or 0.01 to 0.005, or 0.01 to 0.025, or 0.025 to 0.005, and x+y+z=1.00.

The value of z can be at least 0.000025, at least 0.00005, at least 0.0001, at least 0.005, or at least 0.01.

Although the notation used herein value shows x and y to two significant figures and does not show the value of z, it should be understood that z is a value ranging from 0.00001 to 0.001, and that, although only show to two significant figures, the values of x and y account for the value of z. Thus, where composition is designated as $In_{0.27}Ga_{0.73}Sb$, if $z=0.00025$, then the true value of x may be 0.26985 and the true value of y can be 0.72990. Alternately, y can be 0.73000 and x can be 0.26975.

As shown in the Figures, the first cell can include $In_x Ga_y Sb_z$ semiconductor layer(s) of one or more of the p-type, $p^+$-type, the n-type and the $n^+$-type. The first cell can also include InGaAs of one or more of the p-type, $p^+$-type, the n-type and the $n^+$-type.

The second cell can include one or more layers of InGaAs, InP and InGaP. The third cell can include one or more layers of InP, GaP, AlInP and InGaSb. The InGaAs, InGaP, AlInP, InGaSb, InP and/or GaP in the second or third cells can be semiconductor layers of one or more of the p-type, the $p^+$-type, the n-type and the $n^+$-type.

Figure 2:
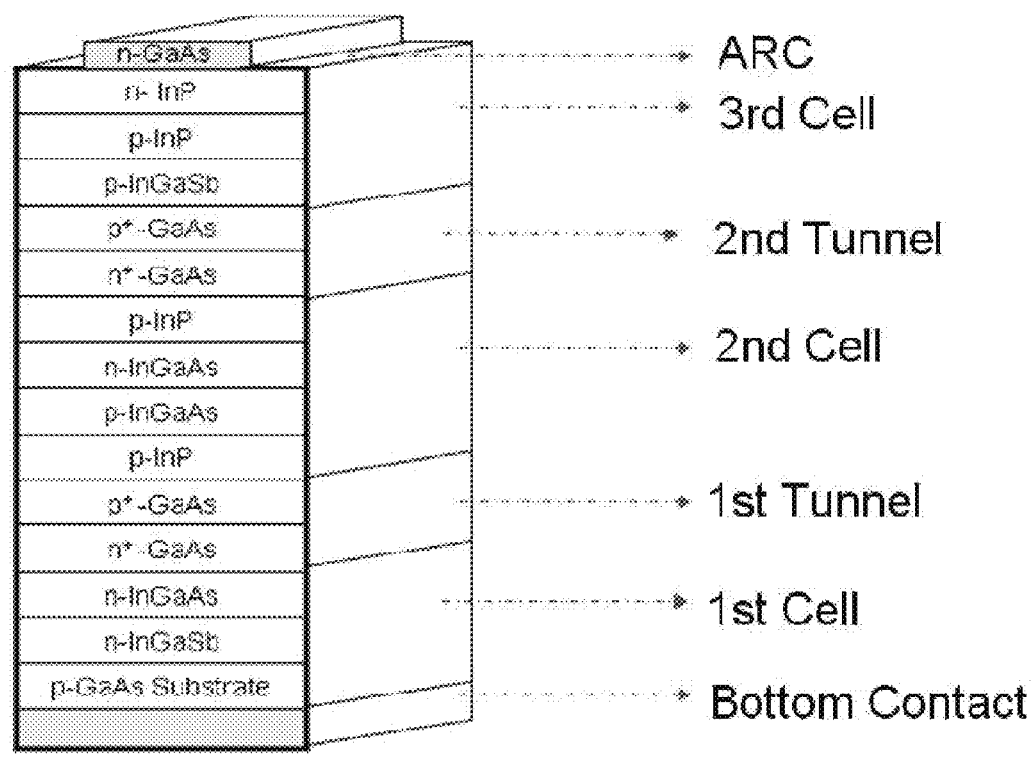
FIG. 2 is a cross-sectional view of a multi-junction InP/InGaAs/InGaSb photovoltaic cell according to an embodiment of the invention.

As shown in FIG. 2, the first and second tunnels can be $p^+$-$n^+$ type junctions that include both a $p^+$-type semiconductor layer and an $n^+$-type semiconductor layer selected from GaAs, AlGaAs, InGaP and InGaAs. For each of the first and second tunnels, the $p^+$-type GaAs semiconductor layer can be over the $n^+$-type GaAs semiconductor layer or the $n^+$-type GaAs semiconductor layer can be over the $p^+$-type GaAs semiconductor layer. Similarly, any of the above tunnels can rely on $p^{++}$-$n^{++}$ type junctions. Generally, the doping levels of the tunnels will be higher that the doping levels of the cells.

As shown in FIG. 2, the first cell can include an InGaSb semiconductor layer. The first cell can include an n-type InGaSb semiconductor layer and the third cell can include a p-type InGaSb semiconductor layer. The first cell can include an n-type InGaSb semiconductor layer but no p-type InGaSb semiconductor layer. The third cell can include a p-type InGaSb semiconductor layer but no n-type InGaSb semiconductor layer. The first cell can be free of Ge, free of p-type InGaSb, or both. As used herein, "free of" can mean that a cell or layer includes <1.0 atomic-% of a composition based on the weight of the cell or layer, or <0.5 atomic-%, or less than 0.1 atomic-%, or less than 0.01 atomic-%, or less than 0.001 atomic-%, or less than 0.0001 atomic-%, or less than 0.00001 atomic-%.

As shown in FIG. 2, the photovoltaic cell can include an antireflective coating ("ARC") on an upper surface. The ARC can be disposed on a third cell, where the third cell includes an n-type InP or GaP layer over a p-type InP or GaP layer over a p-type InGaSb layer. The third layer can be over a second tunnel. The second tunnel can be over a second cell, where the second cell includes a p-type InP layer over an n-type InGaAs layer over a p-type InGaAs layer over a p-type InP layer. The second cell can be over a first tunnel, which can be over a first cell. The first cell can include an n-type InGaAs layer over an n-type InGaSb layer over a p-type GaAs rear contact. The first cell can be over a bottom contact material. The first and second tunnels can include layers of $p^+$-type GaAs, $n^+$-type GaAs, or both.

The photovoltaic cell can include three cells and two junctions where the third, second and first cells comprise (i) InP or GaP, (ii) InGaAs, and (iii) InGaSb, respectively. The third, second and first cells can have band-gap energies in the range of 1.25-1.45 eV, 1.00-1.20 eV and 0.30-0.50 eV, respectively. The third, second and first cells can have band-gap energies of 1.35 eV, 1.1 eV and 0.5 eV, respectively.

Any and all of the layers described herein can be epitaxial layers produced using accepted techniques. Exemplary techniques for growing epitaxial layers include, but are not limited to, vapor-phase epitaxy, liquid-phase epitaxy, solid-phase epitaxy, molecular-beam epitaxy, chemical beam epitaxy, pulsed laser deposition and metal organic chemical vapor deposition (MOCVD).

FIGS. 3 and 5-9 show exemplary embodiments of the photovoltaic cells described herein, while FIG. 4 shows an electrical circuit equivalent diagram showing the three junction diodes and interconnecting upper and lower tunnel junctions of these photovoltaic cells.

FIG. 3 shows a three cell configuration with tunnel junctions disposed between each pair of adjacent cells. The uppermost layer is an anti-reflective coating (ARC), which is present to maximize the amount of impinging radiation that is transmitted through to the underlying cells. The third (or "top") cell includes an $n^+$-type AlInP window layer disposed on an $n^+$-type InP emitter layer that is disposed on a p-type InP base layer. Finally, the bottom layer of the third cell is a $p^+$-type InP back surface field ("BSF") layer. The BSF layer functions like a filter and reflects electromagnetic radiation that can be absorbed by the third cell, while transmitting electromagnetic radiation that can be absorbed by subsequent cells, e.g., the first and second cells. This causes the target wavelength to pass through the relevant cell twice, thereby increasing the absorption efficiency and limiting attenuation.

In FIG. 3, the third cell can be above or disposed on the second (or "upper") tunnel junction. The second tunnel junction includes a $p^{++}$-type AlGaAs layer disposed on an $n^{++}$-type $In_{0.5}Ga_{0.5}P$ layer. The second tunnel junction can be above or disposed on the second cell.

In FIG. 3, the second (or "middle") cell can include an $n^+$-type $In_{0.5}Ga_{0.5}P$ window layer over an $n^+$-type $In_{0.1}Ga_{0.9}As$ emitter that is over a p-type $In_{0.1}Ga_{0.5}As$ base. The bottom layer of the second cell is a p-type InGaAs BSF layer. The second cell can be over or disposed on the first tunnel junction.

In FIG. 3, the first (or "lower") tunnel junction includes a $p^{++}$-type AlGaAs layer disposed on an $n^{++}$-type $In_{0.5}Ga_{0.5}As$ layer. The first tunnel junction can be over or disposed on a buffer layer of n-type $In_{0.5}Ga_{0.5}As$. The buffer layer can be over or disposed on the first cell.

In FIG. 3, the first (or "bottom") cell can include an $n^+$ doped window and nucleation layer over an $n^+$-type $In_{0.5}Ga_{0.5}Sb$ emitter that is over a p-type $In_{0.5}Ga_{0.5}Sb$ base. The base can also be the rear contact. Finally, the photovoltaic cell can be completed with a rear electrical contact.

The window layer is a high band-gap material selected for transparency of light. Exemplary window layers can have a composition of $Al_{0.5}In_{0.5}P_z$, where z can have any of z-range values disclosed herein, including ranging from 0.025 to 0.00001. The window layer is selected such that almost all incident light is transmitted to the lower layers of the cell and to reduce surface recombination of electron-hole pairs, cell series resistance and dark current. Nucleation helps with surface passivation.

In FIG. 3, Zn was used for p-doping, Si was used for n-doping, and the doping levels were as follows:
n-doping and p-doping refer to additions of $1.5 \times 10^{17}$ atoms/cm$^3$, except in the buffer layer, where they referred to $2 \times 10^{17}$ atoms/cm$^3$;
$n^+$-doping and $p^+$-doping referred to $2 \times 10^{18}$ atoms/cm$^3$; and
$n^{++}$-doping and $p^{++}$-doping referred to $2 \times 10^{19}$ atoms/cm$^3$, As used herein, semiconductor layer descriptions that do not include subscripts are intended to include all possible positive ratios of the elements included in the description. Thus, a general reference to ABC semiconductor layer is intended to refer to $A_xB_yC_z$ where $x+y+z=1$ and x, y and z are positive decimal fractions less than 1. A reference to ABC (rel.) indicates that the actual A:B:C ratio is 1:1:1, and ABC (rel.) is intended to be encompassed by all references to an ABC semiconductor layer.

Figure 5:
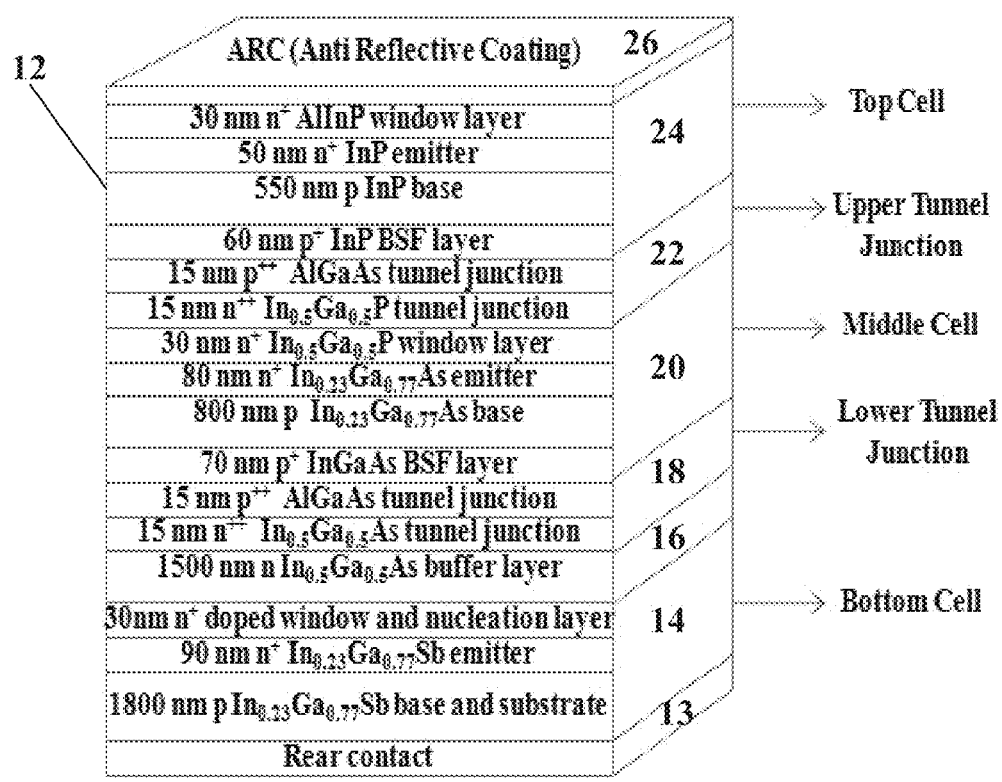
FIG. 5 is a cross-sectional view of a multi-junction InP/InGaAs/InGaSb photovoltaic cell according to an embodiment of the invention.

FIG. 5 is identical to FIG. 3, with the exception that the atomic percentages of some of the layers are different. In particular, in FIG. 5 the InGaAs in the second cell emitter and base layers is $In_{0.23}Ga_{0.77}As$ and the InGaSb in the first cell emitter and base layers is $In_{0.23}Ga_{0.77}Sb$.

Figure 6:
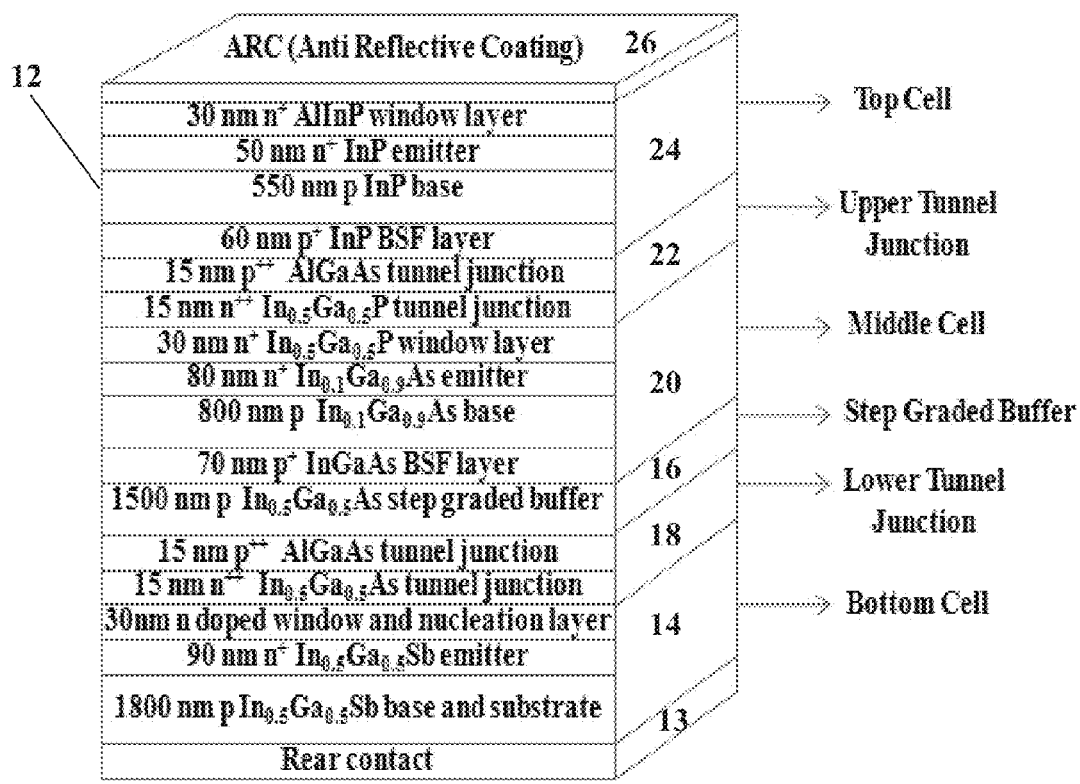
FIG. 6 is a cross-sectional view of a multi-junction InP/InGaAs/InGaSb photovoltaic cell according to an embodiment of the invention.

FIG. 6 is identical to FIG. 3, with the exception that the buffer layer is over or disposed on the first tunnel junction instead of the first tunnel junction being over or disposed on the buffer layer. In addition, the buffer layer is a step graded buffer layer. Any of the buffer layers described herein can be step graded buffer layers. Step graded buffer layers can be used in lattice mismatched or metamorphic (MM) solar cells to release the strain and misfit dislocations between the lattice constant of a particular layer, e.g., the rear contact, on which the buffer layer is disposed relative to that of a layer above or disposed on the buffer layer.

Figure 7:
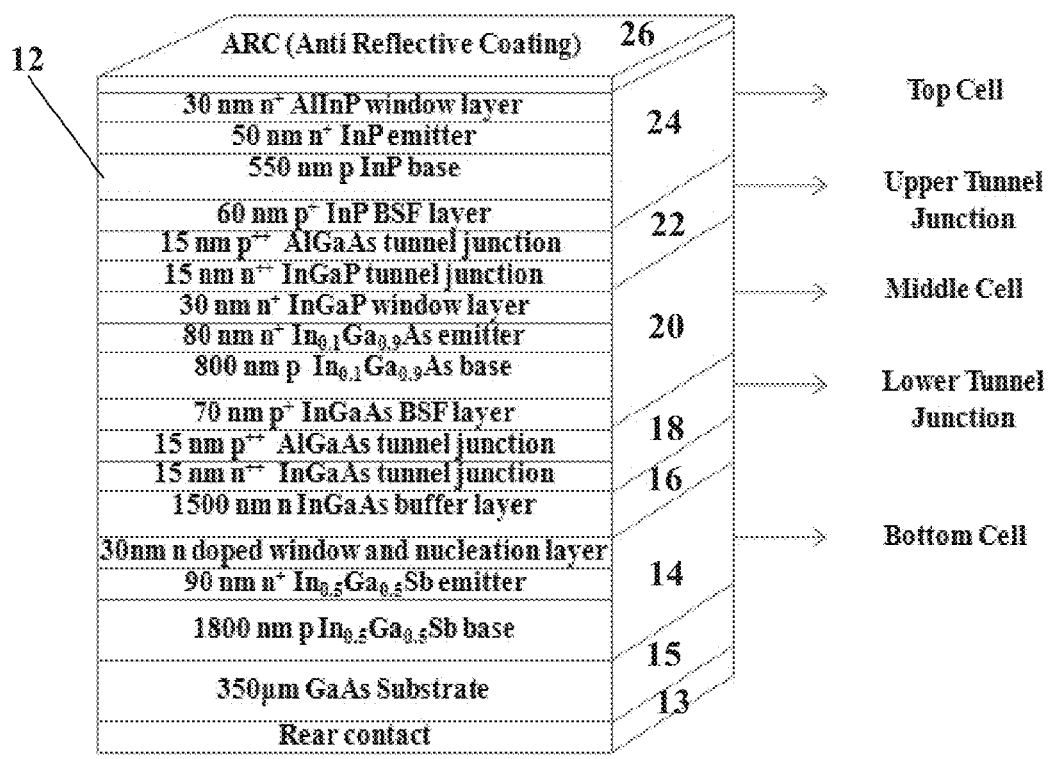
FIG. 7 is a cross-sectional view of a multi-junction InP/InGaAs/InGaSb photovoltaic cell according to an embodiment of the invention.

FIG. 7 is identical to FIG. 3, with the exception of the compositions of a few layers of the photovoltaic cell. In FIG. 7, the bottom layer of the second tunnel junction and the window layer of the second cell are InGaP. In addition, the bottom layer of the first tunnel junction and the buffer layer are InGaAs. Finally, the photovoltaic cell 12 includes a separate substrate 15 including GaAs. The first cell 14 is over or disposed on the GaAs substrate 15, which is over or disposed on the rear contact 13. FIGS. 3 and 5-9 demonstrates that the substrate 15 can either be a separate layer having a composition different from the base layer of the first cell 14 (as in FIG. 7), or the active base layer of the first cell 14 can also serve as the substrate (as in FIGS. 3, 5, 6, 8 and 9).

Figure 8:
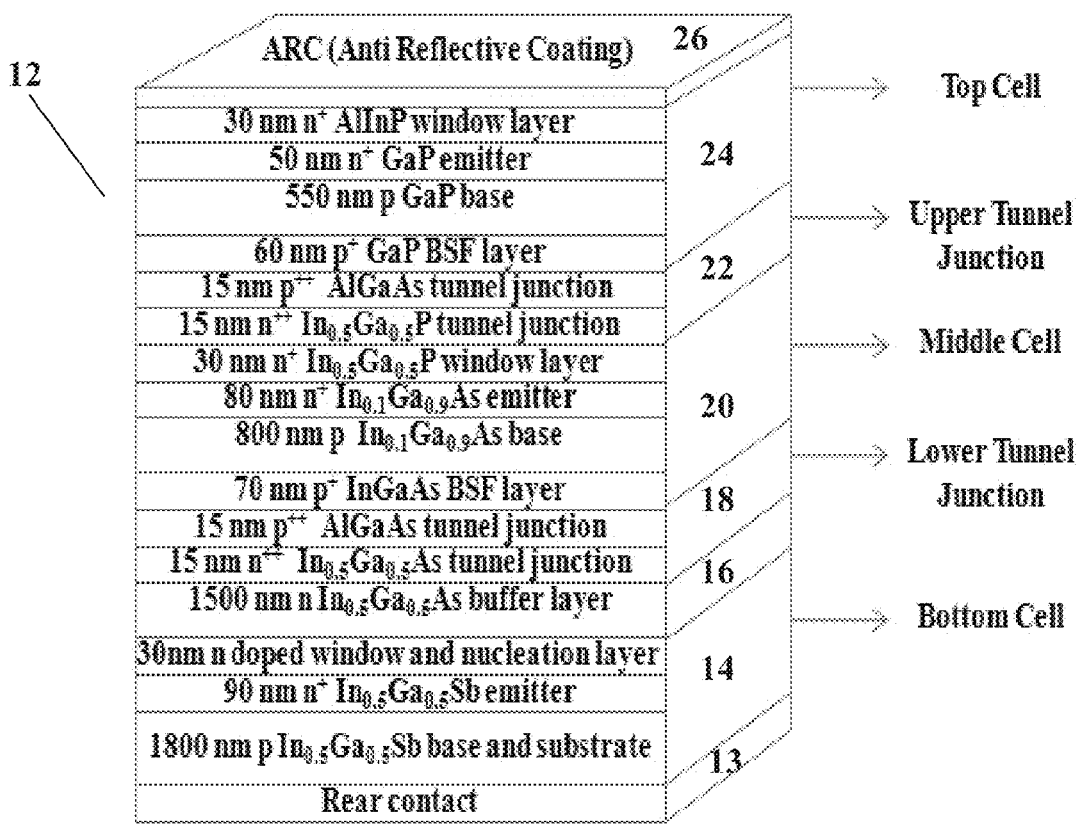
FIG. 8 is a cross-sectional view of a multi-junction GaP/InGaAs/InGaSb photovoltaic cell according to an embodiment of the invention.

FIG. 8 is identical to FIG. 3, with the exception that the third cell is based on GaP rather than InP. In particular, the emitter, base and BSF layers of the third cell are GaP.

Figure 9:
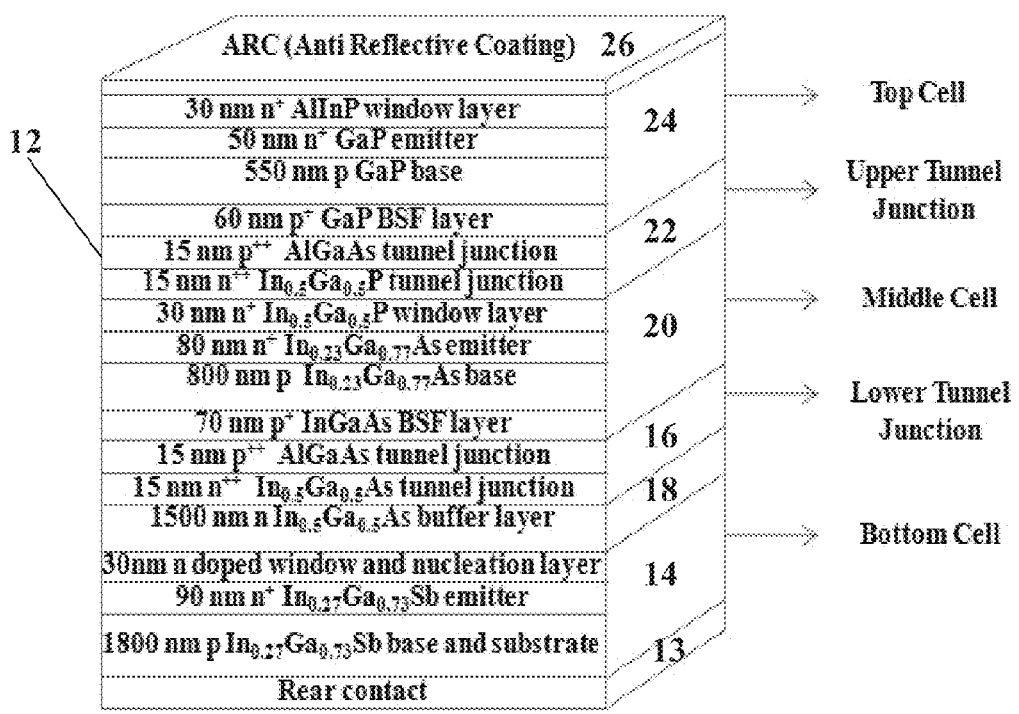
FIG. 9 is a cross-sectional view of a multi-junction GaP/InGaAs/InGaSb photovoltaic cell according to an embodiment of the invention.

Finally, FIG. 9 is identical to FIG. 8, with the exception that the atomic percentages of some of the layers are different. In particular, the InGaSb in the first cell emitter and base layers is $In_{0.23}Ga_{0.77}Sb$.

Figure 10:
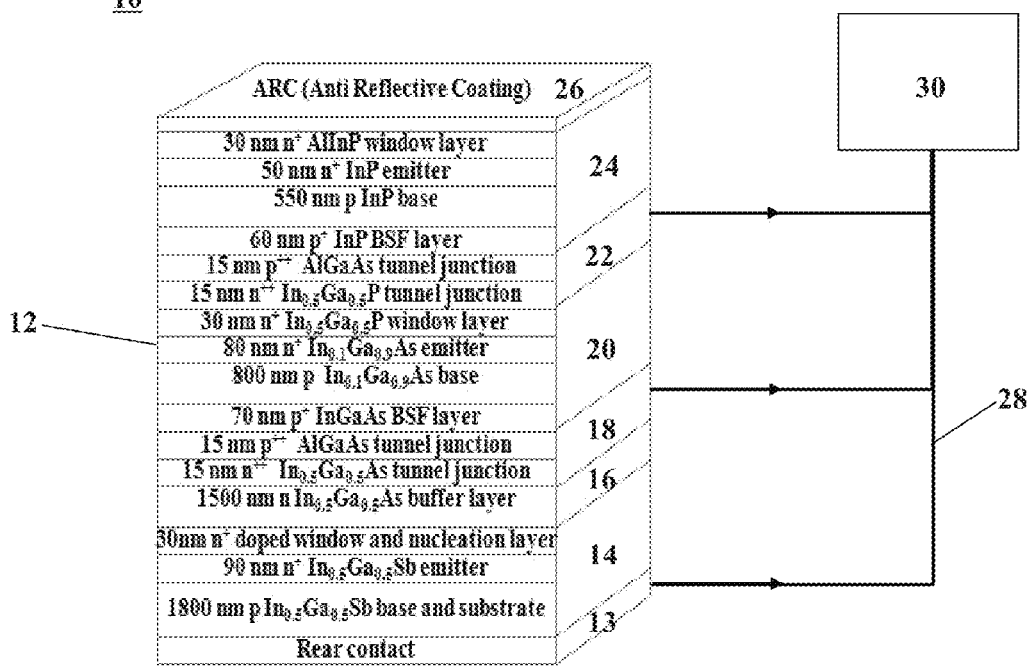
FIG. 10 is a schematic of a solar energy harvesting system including an electromechanical device connected to the multi-junction photovoltaic cell of FIG. 3.

As shown in FIG. 10, the invention also includes a system 10 for harvesting solar energy, comprising at least one of the photovoltaic cells 12 described above in electrical communication with an electromechanical device 30. The electrical connections can be made using electrically conducting wires 28 running between the electromechanical device 30 and at least one of the rear contact 13 and the tunnel junctions 18, 22, independently, Unexpectedly, the combination of the layers described above enables improved absorption of solar radiation across the solar spectrum range for delivering higher efficiency energy harvesting.

As used herein, the term "electromechanical device" is used to describe both electromechanical energy consuming devices and electromechanical storage devices. Exemplary electromechanical energy consuming devices include, but are not limited to, electrical motors, consumer electronics (computers, televisions, calculators, cell phones, etc.), actuators, and residential and commercial power supplies (e.g., internal wiring supplying energy to outlets). Exemplary electromechanical energy storage devices include, but are not limited to, batteries and capacitors.

EXAMPLES

The following examples are based on comparisons of modeled results for efficiency of a photovoltaic cell according to the embodiments disclosed herein with the modeled efficiency of a variety of other known photovoltaic cells.

GaP/InGaAs/InGaSb Cell Configuration

Figure 11:
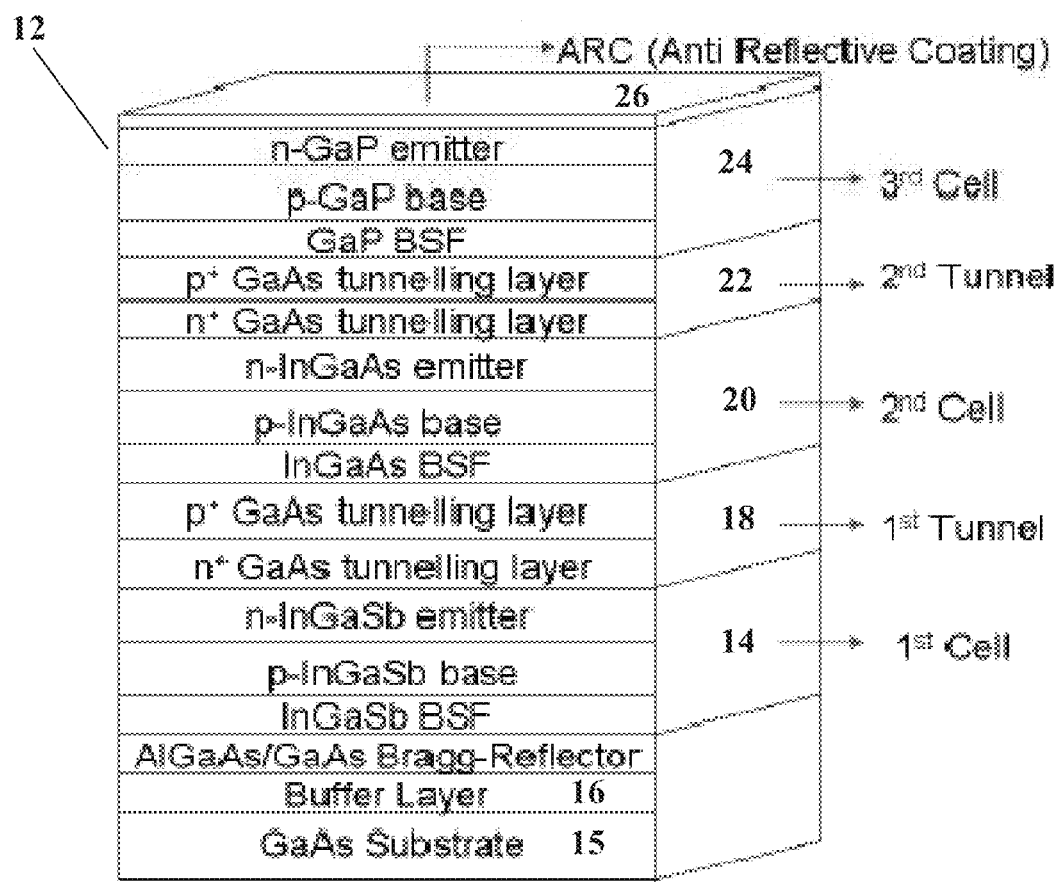
FIG. 11 is a cross-sectional view of a multi-junction GaP/InGaAs/InGaSb photovoltaic cell used to generate model electromagnetic radiation absorption data.

The solar cell design in FIG. 11 is a homogeneous tandem design GaP/InGaAs/InGaSb multijunction solar cell ("GaP/InGaAs/InGaSb Cell"). The cell includes three cells with a tunnel disposed between each pair of adjacent cells. The third cell includes a GaP semiconductor material having a band-gap energy of 2.26 eV, the second cell includes an InGaAs semiconductor having band-gap energy of 1.1 eV, and the first cell includes an InGaSb semiconductor with a band-gap energy or 0.3-0.5 eV depending upon the doping concentration.

As demonstrated by the results to follow, the GaP layer has substantially increased the photon absorption efficiency in the 400 nm-598 nm wavelength range, while the InGaSb layer has substantially increased the photon absorption efficiency in the wavelength range from 598 nm and higher, e.g., 800 nm.

Bright light, e.g., intense sunlight, can provide irradiance levels of 1 kW/m$^2$. Of this energy, 527 Watts is infrared (IR) radiation, 445 Watts visible light and 32 Watts UV radiation. The InGaSb material disclosed herein helps enhance absorption of light in the infrared region compared with state of art solar cells. The higher the photon absorption efficiency, the more electron-hole pairs are created in the cell, which promotes to higher current generation and overall efficiency of the solar cell.

As shown in FIG. 11, an efficient back surface field (BSF) layer is introduced at the bottom of each of the three cells. The primary importance of the BSF layer is to confine the photo-generated minority carriers so that they can be efficiently collected by the tunnel junctions. The BSF layer can provide this confining function without increasing the series resistance of the PV cell. An AlGaAs/GaAs Bragg-Reflector is also included toward the bottom of the photovoltaic cell, The Bragg-Reflector is disposed on a buffer layer that is disposed on the rear contact, a GaAs rear contact in this case. The thickness of the BSF layer and the Bragg-Reflector should be a quarter wavelength for the wavelength being absorbed by the respective cell.

The multilayer dielectric stacks including the BSF layers selectively reflect a part of the unabsorbed photons providing a second pass through the photoactive region, hence increases the photocurrent and overall efficiency of the PV cell. Using multiple layers composed of two materials with different refractive indices nearly 100% reflectance can be obtained over a restricted wavelength of the spectrum.

The BSF layer can be used to enhance localization of the photo-generated minority carriers so that these carriers can be efficiently collected by p/n junctions. The Bragg-reflector selectively reflects a portion of the unabsorbed photons providing a second pass through the photo active region of the cell, thereby increasing the photo current collected by the p/n junctions.

The buffer layer disposed on the GaAs rear contact is included to deal with the lattice mismatch between rear contact and the epitaxial material supported thereon. The third cell in the photovoltaic cell design of FIG. 11 is covered by a thin layer of antireflective coating (ARC) material to reduce the reflection of sunlight impinging on the third cell. The ARC layer is interposed between the photovoltaic cell material and the surrounding environment (air) and is designed to act as a quarter wavelength impedance matching element between the characteristic impedance of the environment and the photovoltaic material.

The tunnel junctions are made up of heavily doped p+/n+ GaAs material. The doping density of these layers is modeled as being $\geq 10^{19}/cm^3$, e.g., $2.0 \times 10^{19}$ atoms/cm$^3$. They are used to make better electrical, optical and mechanical connections between different cell layers. The PV cell is developed over a p-type or n-type GaAs rear contact material. In FIG. 11, the n-doping material is Si and the p-doping material is Zn. Doping levels were as follows:

BSF layers were doped with Zn at a level of $2 \times 10^{18}$ atoms/cm$^3$;

Tunnel layers were doped at a level of $2 \times 10^{19}$ atoms/cm$^3$;

Cell layers designated as n or p were doped as a level of $2 \times 10^{18}$ atoms/cm$^3$;

Base layers were doped at a level of $1.5 \times 10^{17}$ atoms/cm$^3$; and

Buffer layers were doped at a level of $2 \times 10^{17}$ atoms/cm$^3$.

The three-junction photovoltaic solar cell of FIG. 11 includes GaP/InGaAs/InGaSb semiconductor materials having band-gaps of 1.35 eV, 1.1 eV, and 0.3-0.5 eV, respectively, and is compared to the solar absorption efficiencies of some existing solar cells. The solar cell can be formed in both lattice matched and lattice mismatched configurations as well as mechanically stacking the layers. As demonstrated by the model results, the GaP/InGaAs/InGaSb cell exhibited extremely high efficiencies throughout the entire light spectrum for light incident at 45°.

GaP/InGaAs/InGaSb Cell Absorption Data

Figure 12:
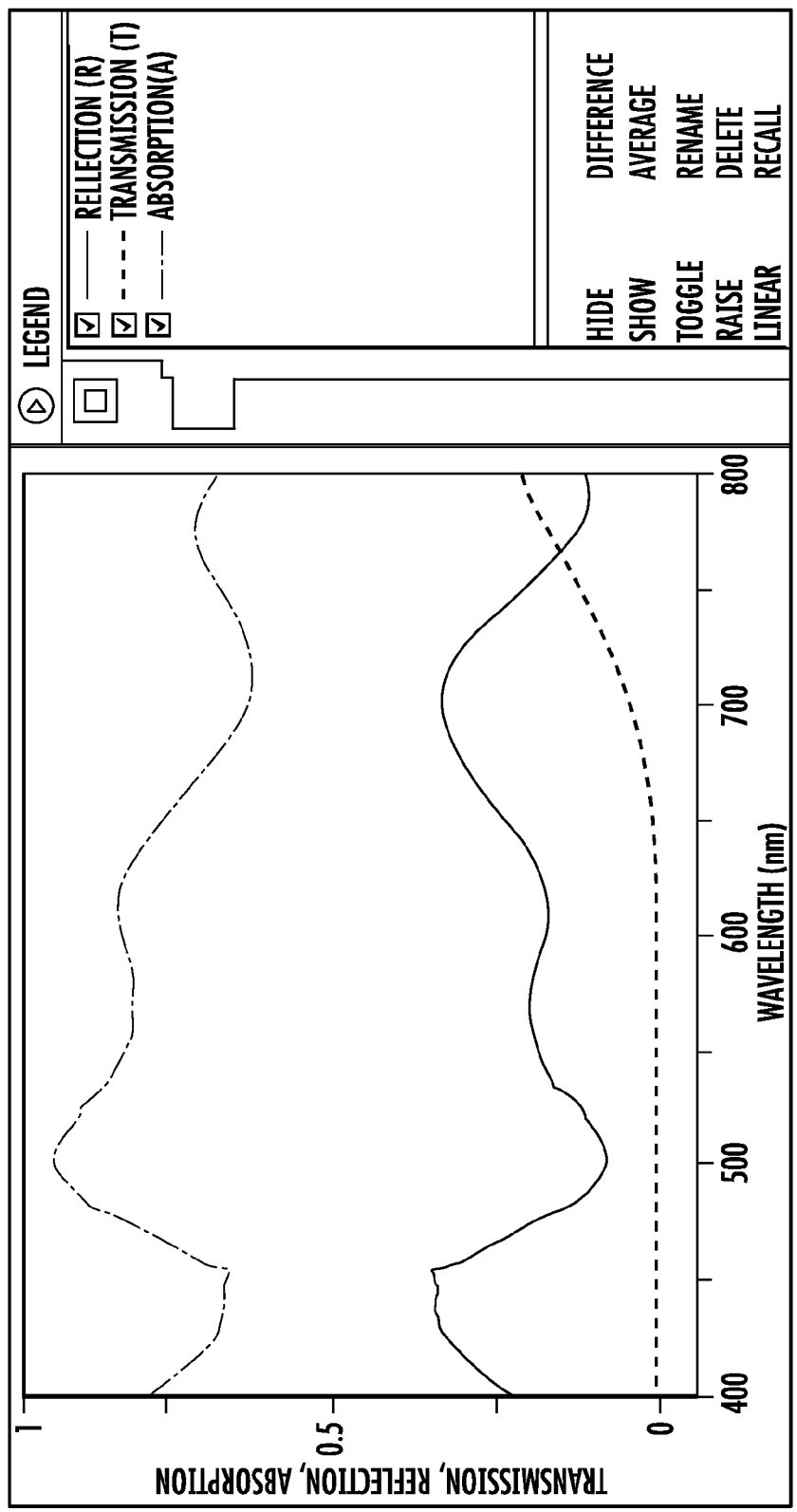
FIG. 12 is a chart showing reflection, transmission and absorption of 45° incident electromagnetic radiation for a GaP/InGaAs/InGaSb photovoltaic cell.

FIG. 12 and Table 1 illustrate the modeled absorption of the photovoltaic cell of FIG. 11 at 45° incidence. In FIG. 12, the top line represents absorption and lines in the middle and bottom position at the far left of FIG. 12 represent reflection and transmission, respectively. The data demonstrate that the GaP/InGaAs/InGaSb cell has very good absorption throughout the solar spectrum. Table 1 lists the absorption efficiency of the triple-junction solar cell for a variety of wavelengths.

TABLE 1

Absorption Efficiency of GaP/InGaAs/InGaSb solar cell

| Wavelength | Absorption |
|---|---|
| 400 nm | 77.2% |
| 500 nm | 92.3% |
| 600 nm | 82% |
| 700 nm | 63.1% |
| 800 nm | 68% |

GaP/InGaAs/InGaSb Cell Comparison with Single-Junction Crystalline-Si Cell

Figure 13:
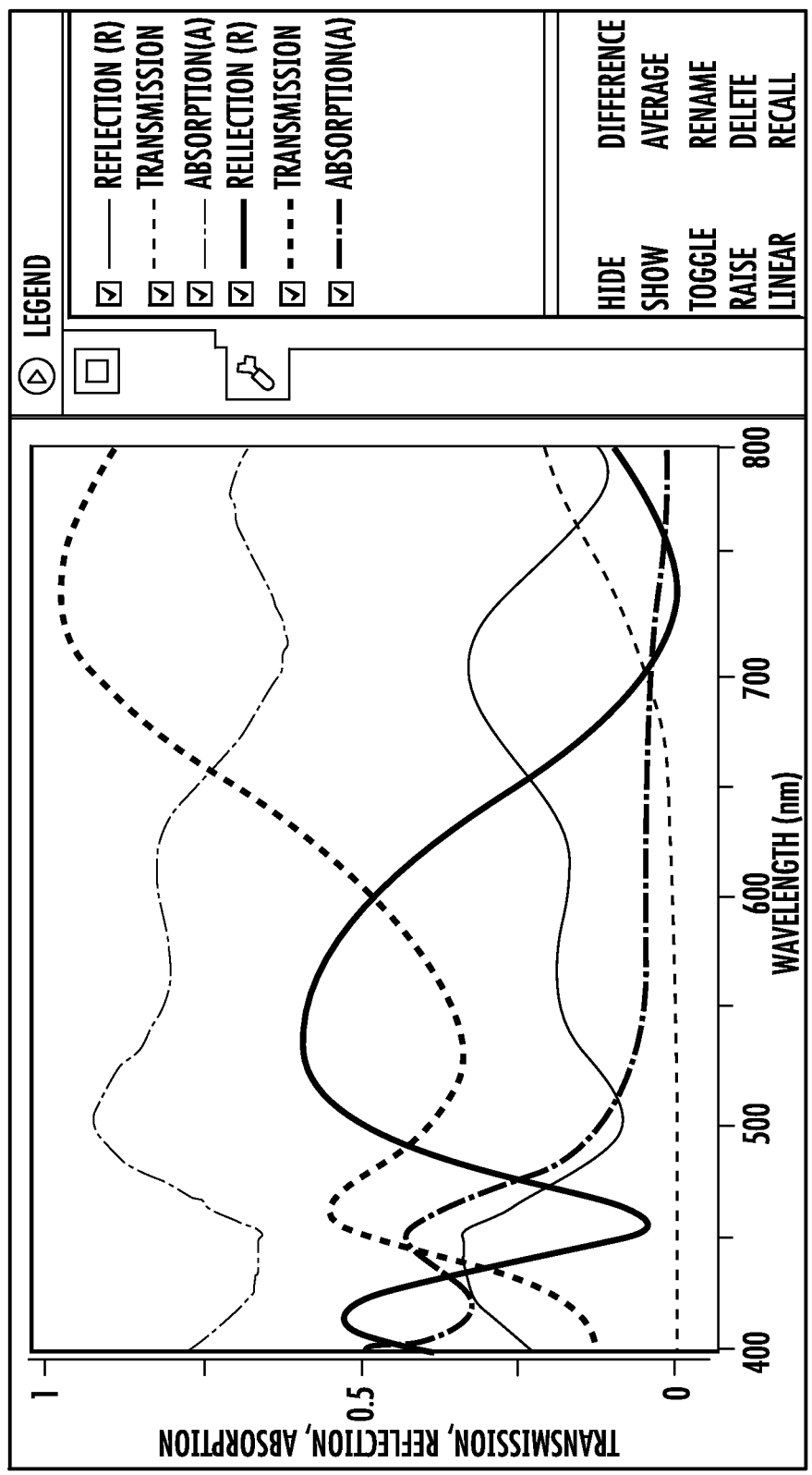
FIG. 13 is a chart comparing the data from FIG. 12 with reflection, transmission and absorption of 45° incident electromagnetic radiation for a single-junction crystalline Si photovoltaic cell.

FIG. 13 illustrates the modeled performance of a single junction crystalline-Si solar cell compared with the GaP/InGaAs/InGaSb cell. The bold lines represent the performance of the single-junction crystalline-Si solar cell, while the light lines the performance of the triple-junction GaP/InGaAs/InGaSb cell. Thus, the triple-junction GaP/InGaAs/InGaSb cell performs better than the most popular single junction cell (c-Si) throughout the solar spectrum. Table 2 provides the absorption data points for specific wavelengths from FIG. 13.

TABLE 2

Comparison of Absorption Efficiency between GaP/InGaAs/InGaSb solar cell and crystalline Si solar cell

| Wavelength | Absorption of GaP/InGaAs/InGaSb | Absorption of c-Si |
|---|---|---|
| 400 nm | 77.2% | 45% |
| 500 nm | 92.3% | 11.6% |
| 600 nm | 82% | 4.73% |
| 700 nm | 63.1% | 3.34% |
| 800 nm | 68% | 1.29% |

GaP/InGaAs/InBaSb Cell Comparison with AlGaAs/Si Monolithic Two-Junction Cell

Figure 14:
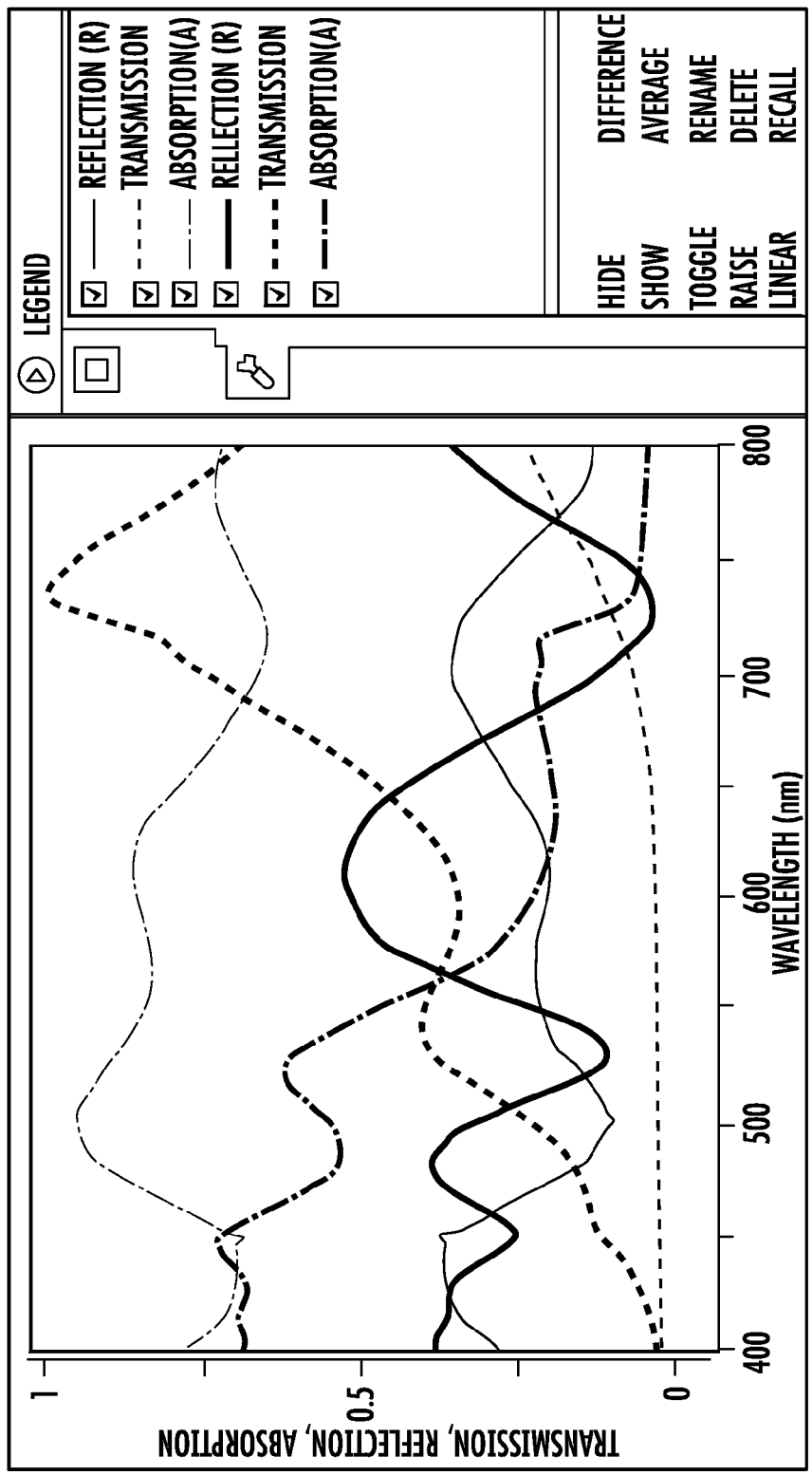
FIG. 14 is a chart comparing the data from FIG. 12 with reflection, transmission and absorption of 45° incident electromagnetic radiation for a double-junction AlGaAs/Si photovoltaic cell.

An AlGaAs/Si monolithic two-junction cell is a prior art cell with an attractive combination of materials for obtaining high-efficiency multijunction cells. In addition to an ideal combination of band-gaps the Si rear contact and cell technologies are well developed and inexpensive. Umeno et al. (1998) fabricated a solar cell comprised of $Al_{0.15}Ga_{0.85}As/Si$ two-junction solar cell by MOCVD process and reported an efficiency of 21.2% under AM0. FIG. 14 shows a modeled comparison of the AlGaAs/Si two-junction cell with the GaP/InGaAs/InGaSb triple-junction cell disclosed herein. The bold lines illustrate the absorption efficiency of the two-junction solar cell and the light lines for the GaP/InGaAs/InGaSb cell. In addition, Table 3 shows the relative improvements in absorption efficiency for the GaP/InGaAs/InGaSb cell over the comparative cell.

TABLE 3

Comparison of Absorption Efficiency between Ga/InGaAs/InGaSb cell and AlGaAs/Si double-junction solar cell

| Wavelength | Absorption of Ga/InGaAs/InGaSb | Absorption of AlGaAs/Si |
|---|---|---|
| 400 nm | 77.2% | 65.4% |
| 500 nm | 92.3% | 52.2% |
| 600 nm | 82% | 20.3% |
| 700 nm | 63.1% | 18.6% |
| 800 nm | 68% | 1.18% |

GaP/InGaAs/InGaSb Cell Comparison with InP/InGaAs Two-Junction Cell

Figure 15:
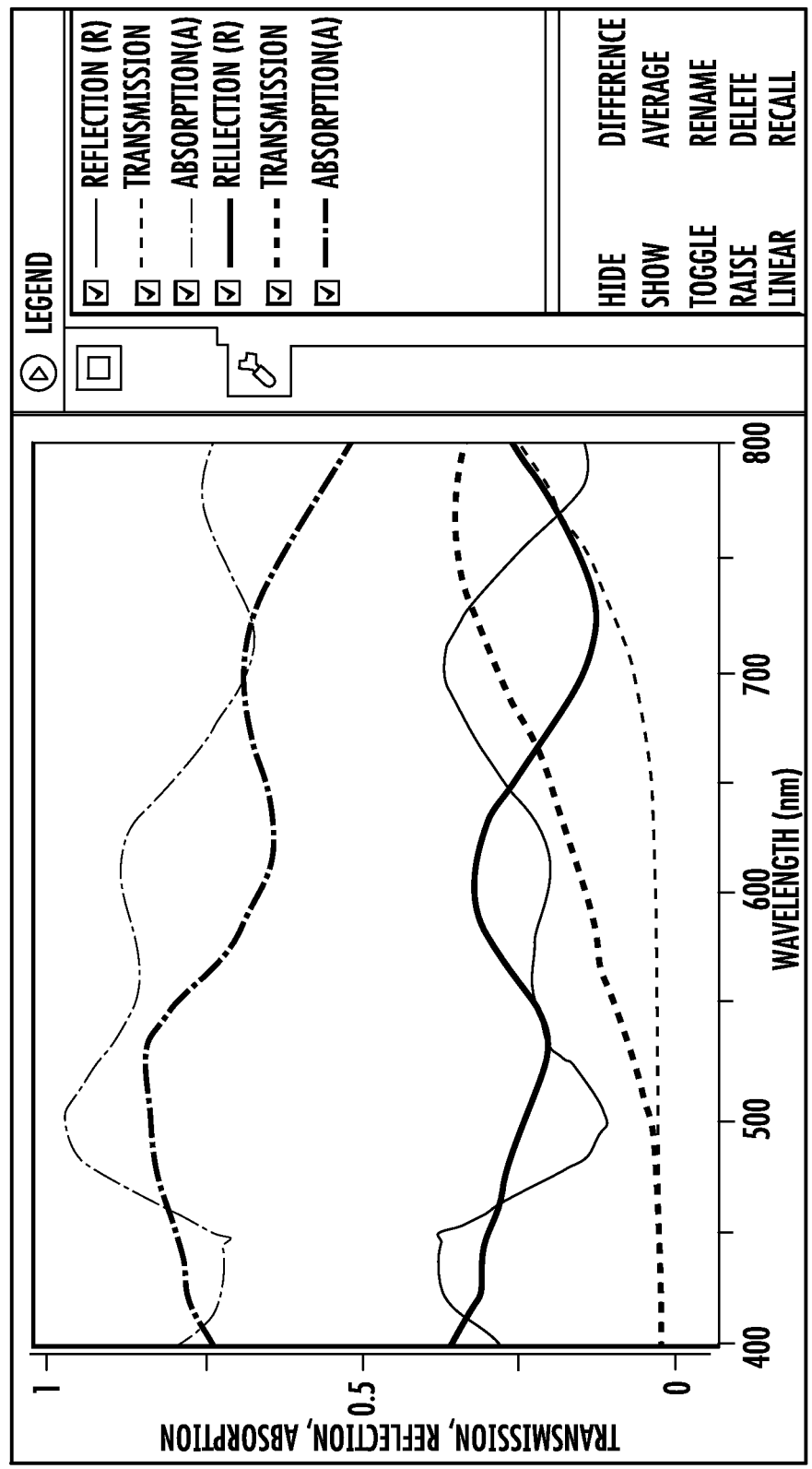
FIG. 15 is a chart comparing the data from FIG. 12 with reflection, transmission and absorption of 45° incident electromagnetic radiation for a double-junction InP/InGaAs photovoltaic cell.

The combination of InP with a band-gap energy of 1.35 eV and $In_{0.53}Ga_{0.47}As$ with a band-gap energy of 0.75 eV is a lattice-matched system having a theoretical conversion efficiency of 37% under 500 Suns AM1.5G and 33% under 500 Suns AM0 at 80° C. (Wanlass et. al., 1989). The InP/InGaAs double-junction cell is considered very high promising in space applications because InP is more radiation resistant than any other semiconductor materials (Yamaguchi et. al. 1984). An efficiency of 31.8% has been achieved using a metal interconnected three-terminal, monolithic two-junction InP/InGaAs cell under 50 Suns AM1.5 at 25° C. (Wanlass et. al., 1991). In FIG. 15, the bold lines represent the properties of the InP/InGaAs double-junction cell, while the light lines represent the properties of the GaP/InGaAs/InGaSb three-junction cell disclosed herein. The model data in FIG. 15 and Table 4 shows that the GaP/InGaAs/InGaSb exhibits absorption that is superior to the InP/InGaAs two-junction cell.

TABLE 4

Comparison of Absorption Efficiency between GaP/InGaAs/InGaSb cell and InP/InGaAs double-junction solar cell

| Wavelength | Absorption of Ga/InGaAs/InGaSb | Absorption of InP/InGaAs |
|---|---|---|
| 400 nm | 77.2% | 67.4% |
| 500 nm | 92.3% | 78.8% |
| 600 nm | 82% | 61.9% |
| 700 nm | 63.1% | 63.1% |
| 800 nm | 68% | 47.9 |

GaP/InGaAs/InGaSb Cell Comparison with AlGaAs/GaAs/InGaAs Three-Junction Cell

Figure 16:
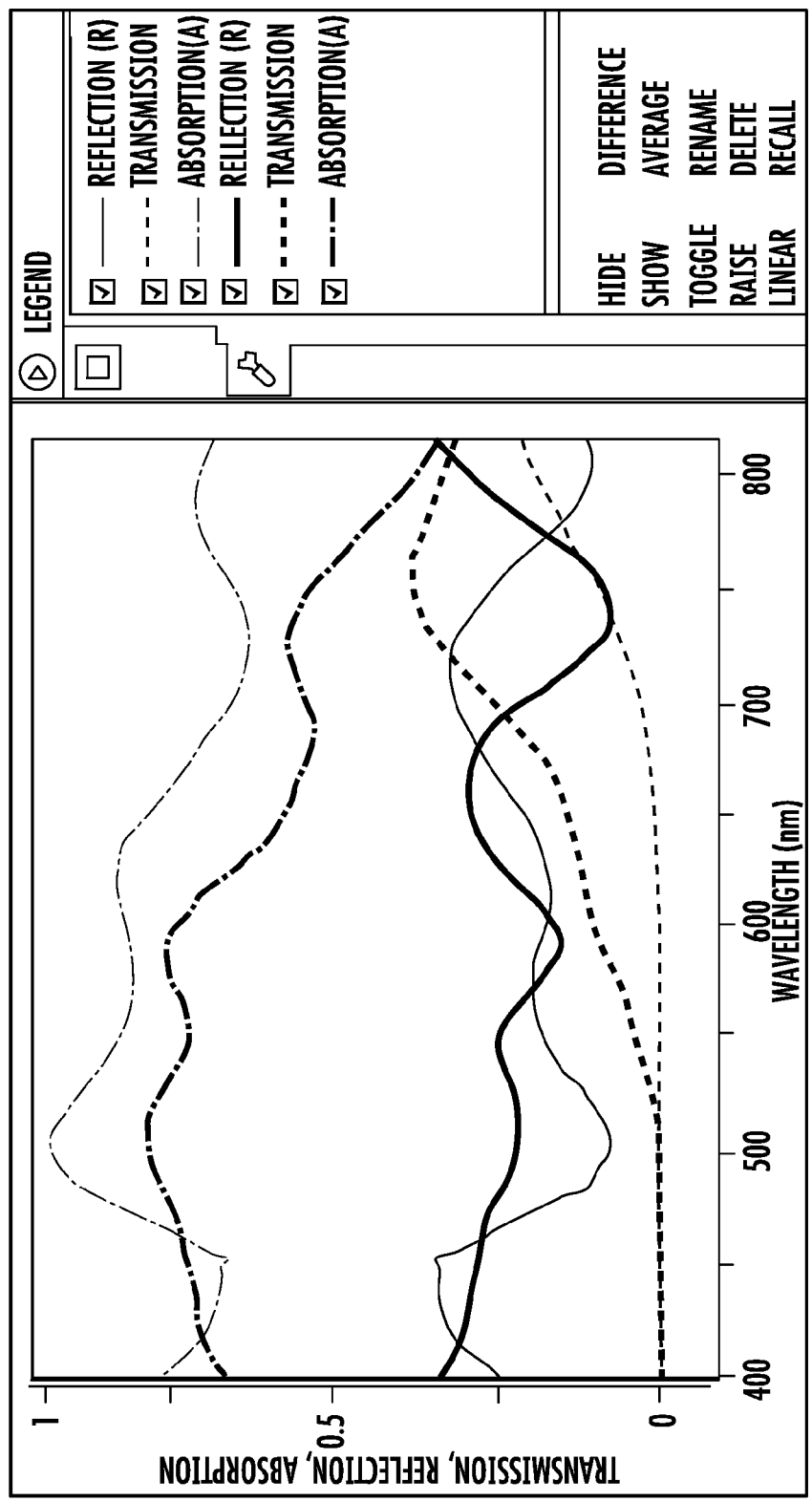
FIG. 16 is a chart comparing the data from FIG. 12 with reflection, transmission and absorption of 45° incident electromagnetic radiation for a triple-junction AlGaAs/GaAs/InGaAs photovoltaic cell.

A comparative three-junction solar cell with 1.93 eV AlGaAs, 1.43 eV GaAs and 0.95 eV InGaAs(P) has predicted efficiencies of 37.5% at 1 Sun AM1.5 and 46% at 400 Suns AM1.5 (MacMillan et al., 1989). This two-terminal three-junction solar cell with an AM0 efficiency of 25.2% has been reported (Chung et. al., 1991). The AlGaAs/GaAs/InGaAs cell was mechanically stacked having AlGaAs/GaAs metal-interconnection and InGaAsP as bottom cell. More recently a mechanically stacked three-junction cell consisting of mono-lithically grown InGaP/GaAs two-junction cell and InGaAs bottom cell has reached 33.3% at 1 Sun AM1.5 (Takamoto et. al., 1997). FIG. 16 and Table 5 show comparative absorption efficiency values for the AlGaAs/GaAs/InGaAs triple-junction solar cell with the GaP/InGaAs/InGaSb cell disclosed herein. The absorption date demonstrates that the GaP/InGaAs/InGaSb solar cell disclosed herein outperforms the comparative AlGaAs/GaAs/InGaAs cell. In FIG. 16, the bold lines are for the AlGaAs/GaAs/InGaAs solar cell and the light ones for the GaP/InGaAs/InGaSb design.

TABLE 5

Comparison of Absorption Efficiency between GaP/InGaAs/InGaSb cell and triple-junction solar cell made up of AlGaAs/GaAs/InGaAs

| Wavelength | Absorption of GaP/InGaAs/InGaSb | Absorption of AlGaAs/GaAs/InGaAs |
|---|---|---|
| 400 nm | 77.2% | 65.8% |
| 500 nm | 92.3% | 77.8% |
| 600 nm | 82% | 71.3% |
| 700 nm | 63.1% | 55.3% |
| 800 nm | 68% | 34.5% |

InP/InGaAs/InGaSb Cell Configuration

Figure 17:
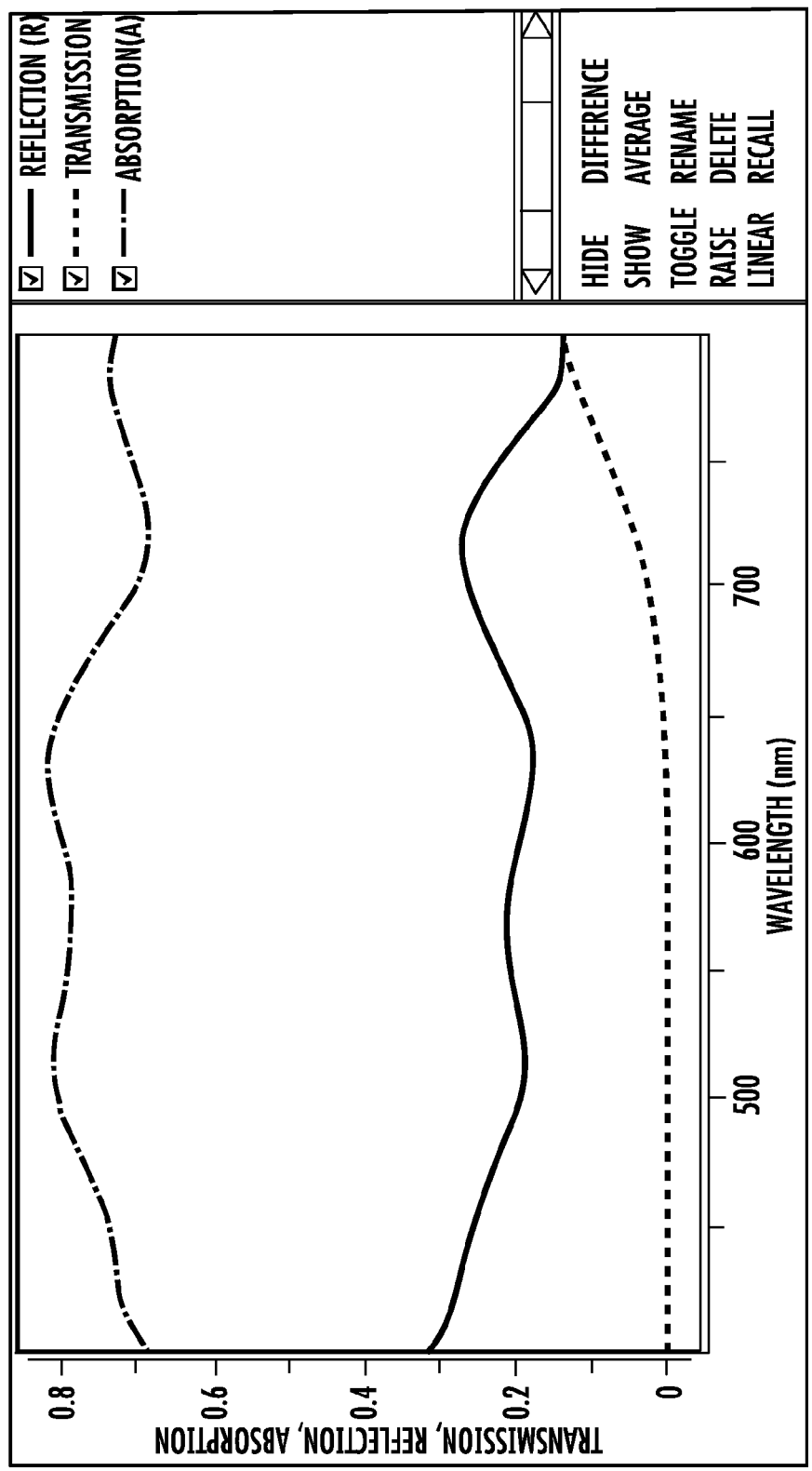
FIG. 17 is a chart showing reflection, transmission and absorption of 45° incident electromagnetic radiation for a InP/InGaAs/InGaSb photovoltaic cell.

Data modeling the absorption data for the InP/InGaAs/InGaSb cell configuration shown in FIG. 2 was also generated. The doping levels were held constant for equivalent layers in the two configurations (i.e., FIG. 2 and FIG. 11). The primary difference between the two was the substitution of InP for GaP in the third cell of the triple-junction cells disclosed herein. The absorption results are summarized in FIG. 17 and Table 6. Again, these absorption results are superior to the modeled absorption results discussed above.

TABLE 6

Comparison of Absorption Efficiency between InP/InGaAs/InGaSb cell and GaP/InGaAs/InGaSb cell

| Wavelength | Absorption of InP/InGaAs/InGaSb | Absorption of GaP/InGaAs/InGaSb |
|---|---|---|
| 400 nm | 69% | 77.2% |
| 500 nm | 81% | 92.3% |
| 600 nm | 80.2% | 82% |
| 700 nm | 71% | 63.1% |
| 800 nm | 73% | 68% |

In summary, the model data demonstrates that, compared with existing technology, the GaP/InGaAs/InGaSb triple-junction solar cell disclosed herein exhibits far superior absorption efficiency across the electromagnetic spectrum. In particular, the data demonstrates that the inclusion of trace amounts of Sb (i.e., 0.00001-0.00025 atomic-%) in an InGaSb semiconductor layer substantially improve absorption of electromagnetic radiation in the range from 598 to 800 nm. In addition, the data demonstrates that, compared with InP, GaP provides improved absorption of electromagnetic radiation in the range from 400 to 598 nm.

It is to be understood that while the invention in has been described in conjunction with the preferred specific embodiments thereof, that the foregoing description as well as the preceding examples are intended to illustrate and not limit the scope of the invention. Other aspects, advantages and modifications within the scope of the invention will be apparent to those skilled in the art to which the invention pertains.

We claim:
1. A photovoltaic cell, comprising:
a rear contact;
a first cell having a first band-gap energy
the first cell consisting of:
  an emitter layer,
  a base layer,
  a substrate,
  optionally a window layer, and
  optionally a nucleation layer;
a second cell having a second band-gap energy, wherein the second band-gap energy is from 1.0 to 1.2 eV;
a first tunnel disposed between said first cell and said second cell;
optionally a buffer layer disposed between the first tunnel and the first cell;
a third cell having a third band-gap energy; and
a second tunnel disposed between said second cell and said third cell, wherein said first cell is over said rear contact, said second cell is over said first cell, and said third cell is over said second cell, and
wherein said combination of emitter layer, base layer and substrate comprise $In_xGa_ySb_z$, wherein $x+y+z=1$ and z ranges from 0.00001 to 0.025.

2. The photovoltaic cell according to claim 1, wherein said first band-gap energy is less than said second band-gap energy, and said second band-gap energy is less than said third band-gap energy.

3. The photovoltaic cell according to claim 2, wherein said first bad-gap energy is between 0.25 eV and 0.55 eV.

4. The photovoltaic cell according to claim 1, wherein said first cell comprises an n+-doped $In_xGa_ySb_z$ semiconductor layer and a p-doped $In_xGa_ySb_z$.

5. The photovoltaic cell according to claim 1, wherein said first cell comprises a semiconductor layer comprising $In_xGa_ySb_z$, wherein:
x ranges from 0.23 to 0.50,
y ranges from 0.50 to 0.77, and
z ranges from 0.00001 to 0.025.

6. The photovoltaic cell according to claim 1, wherein said third cell comprises one or more of InP, GaP, AlInP, AlGaInP, and InGaSb.

7. The photovoltaic cell according to claim 1, wherein said second cell comprises one or more of InGaAs, InP, and InGaP.

8. The photovoltaic cell according to claim 1, wherein said third cell comprises one or more of InP, GaP, AlInP, AlGaInP, and InGaSb; and said second cell comprises one or more of InGaAs, InP, and InGaP.

9. The photovoltaic cell according to claim 8, wherein
(i) said first tunnel comprises a $p^{++}$-type GaAs or a $p^{++}$-type AlGaAs semiconductor layer and an $n^{++}$-type GaAs or $n^{++}$-type InGaAs semiconductor layer;
(ii) said second tunnel comprises a $p^{++}$_type GaAs or a $p^{++}$_type AlGaAs semiconductor layer and an n+-type GaAs or a n++-type InGaP semiconductor layer; or
(iii) both.

10. The photovoltaic cell according to claim 1, wherein
(i) said first tunnel comprises a $p^{++}$_type GaAs or a $p^{++}$_type AlGaAs semiconductor layer and an $n^{++}$-type GaAs or $n^{++}$-type InGaAs semiconductor layer;
(ii) said second tunnel comprises a $p^{++}$-type GaAs or a $p^{++}$-type AlGaAs semiconductor layer and an $n^{+}$-type GaAs or a $n^{++}$-type InGaP semiconductor layer; or
(iii) both.

11. The photovoltaic cell according to claim 1, wherein the third cell comprises an $In_xGa_ySb_z$ semiconductor layer.

12. The photovoltaic cell according to claim 1, wherein said first cell comprises an n-type InGaSb semiconductor layer and said third cell comprises a p-type InGaSb semiconductor layer.

13. The photovoltaic cell according to claim 1, wherein
said first cell comprises an InGaAs semiconductor layer;
said second cell comprises one or more of an InGaAs semiconductor layer, an InP semiconductor layer, and an InGaP semiconductor layer; and
said third cell comprises one or more of an InP semiconductor layer, a GaP semiconductor layer, an AlInP semiconductor layer, an AlGaInP semiconductor layer, and an InGaSb semiconductor layer.

14. The photovoltaic cell according to claim 13, wherein
(i) said first tunnel comprises a $p^{++}$-type GaAs or a $p^{++}$-type AlGaAs semiconductor layer and an $n^{++}$-type GaAs or $n^{++}$-type InGaAs semiconductor layer;
(ij) said second tunnel comprises a $p^{++}$-type GaAs or a $p^{++}$-type AlGaAs semiconductor layer and an $n^{+}$-type GaAs or a $n^{++}$-type InGaP semiconductor layer; or
(iii) both.

15. The photovoltaic cell according to claim 1, wherein
said second cell comprises an InGaAs semiconductor layer and an InGaP semiconductor layer; and
said third cell comprises a window layer comprising an AlGaInP semiconductor layer and a subcell layer comprising a GaP semiconductor layer.

16. A system for harvesting solar energy, comprising an electromechanical device in electrical communication with at least one photovoltaic cell according to claim 1.

17. The photovoltaic cell according to claim 1, wherein z ranges from 0.00001 to 0.00025.

18. The photovoltaic cell according to claim 1, wherein the third band-gap energy is from is from 1.25 to 2.26 eV.

19. The photovoltaic cell according to claim 1, wherein said second cell comprises InGaAs.

20. The photovoltaic cell according to claim 1, wherein said third cell comprises one or more of GaP, and wherein the third band-gap energy is about 2.26 eV.

21. The photovoltaic cell according to claim 1, wherein said third cell comprises one or more of InP, and wherein the third band-gap energy is about 1.35 eV.

* * * * *